(12) United States Patent
Arakawa

(10) Patent No.: US 8,283,940 B2
(45) Date of Patent: Oct. 9, 2012

(54) PROBE DEVICE, PROCESSING DEVICE, AND PROBE TESTING METHOD

(75) Inventor: Yasutaka Arakawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 12/560,272

(22) Filed: Sep. 15, 2009

(65) Prior Publication Data

US 2010/0148810 A1 Jun. 17, 2010

(30) Foreign Application Priority Data

Dec. 15, 2008 (JP) ................................ 2008-318416

(51) Int. Cl.
*G01R 31/02* (2006.01)
*G01R 31/26* (2006.01)

(52) U.S. Cl. ......... 324/756.03; 324/754.01; 324/754.07; 324/755.01; 324/762.05

(58) Field of Classification Search ............. 324/756.03, 324/757.03, 762.05
See application file for complete search history.

(56) References Cited

U.S. PATENT DOCUMENTS

| | | | | |
|---|---|---|---|---|
| 5,166,603 A | * | 11/1992 | Hoshi | ...................... 324/750.16 |
| 5,410,259 A | | 4/1995 | Fujihara et al. | |
| 2011/0050276 A1 | * | 3/2011 | Sano et al. | ................. 324/762.05 |

FOREIGN PATENT DOCUMENTS

| | | |
|---|---|---|
| JP | 2003-218176 | 7/2003 |
| JP | 2003-332189 | 11/2003 |
| JP | 2005-216904 | 8/2005 |
| JP | 2008-210831 | 9/2008 |

OTHER PUBLICATIONS

Office Action issued by the Japanese Patent Office on May 29, 2012, for Japanese Patent Application No. 2008-318416, and English-language translation thereof.

* cited by examiner

*Primary Examiner* — Melissa Koval
*Assistant Examiner* — Emily Chan
(74) *Attorney, Agent, or Firm* — Finnegan, Henderson, Farabow, Garrett & Dunner, L.L.P.

(57) ABSTRACT

Provision of a probe device, a processing device and a probe test capable of performing an efficient wafer probe test. A probe device, comprising a plurality of measuring stages to which a plurality of probe cards for inspecting semiconductor wafers are connected, respectively; a first conveying portion for conveying a semiconductor wafer to a first measuring stage to which a first probe card is connected; a first inspection control portion for controlling the inspection of the semiconductor wafer by the first probe card; a receiving portion for receiving stage information including information showing nonuse of the first measuring stage from a processing device; a second conveying portion for conveying the semiconductor wafer to a second measuring stage, to which a second probe card different from the first probe card is connected, according to the received stage information; and a second inspection control portion for controlling the inspection of the semiconductor wafer by the second probe card.

14 Claims, 13 Drawing Sheets

FIG. 2A

| Port | LOT | Process | Kind | Wafer |
|---|---|---|---|---|
| 100a | A | A | A | W01 |
| | | | | W02 |
| | | | | W03 |
| | | | | W04 |
| | | | | W05 |
| | | | | W06 |
| | | | | W07 |
| | | | | W08 |
| | | | | W09 |
| | | | | W10 |

FIG. 2B

| Port | LOT | Process | Kind | Wafer |
|---|---|---|---|---|
| 100b | B | A | A | X01 |
| | | | | X02 |
| | | | | X03 |
| | | | | X04 |
| | | | | X05 |

FIG. 4

| Card | Wafer | Transmission sequence | Address | | DUT | Result(1st) |
|---|---|---|---|---|---|---|
| | | | X | Y | | |
| S3 | W02 | 1 | 1 | 1 | #1 | Fail |
| | | | 1 | 2 | #2 | Pass |
| | | | 1 | 3 | #3 | Pass |
| | | | 1 | 4 | #4 | Pass |
| | | 2 | 2 | 1 | #1 | Fail |
| | | | 2 | 2 | #2 | Pass |
| | | | 2 | 3 | #3 | Pass |
| | | | 2 | 4 | #4 | Pass |
| | | 3 | 3 | 1 | #1 | Fail |
| | | | 3 | 2 | #2 | Pass |
| | | | 3 | 3 | #3 | Pass |
| | | | 3 | 4 | #4 | Pass |
| | | 4 | 4 | 1 | #1 | Fail |
| | | | 4 | 2 | #2 | Pass |
| | | | 4 | 3 | #3 | Pass |
| | | | 4 | 4 | #4 | Pass |

FIG. 7

| Lot information | Usable stage |
|---|---|
| A | No1~No4 |
| B | |
| C | No1~No3 |
| D | |
| ⋮ | ⋮ |
| Kind information | Usable stage |
| A | No1, No2 |
| B | No3, No4 |
| C | No2, No3 |
| ⋮ | ⋮ |
| Process information | Usable stage |
| A | No1~No3 |
| B | No4 |
| C | No2, No3 |
| ⋮ | ⋮ |

FIG. 8

| Wafer | X | Y | Card | DUT | Result(1st) | Card | DUT | Result(2nd) |
|---|---|---|---|---|---|---|---|---|
| W01 | 1 | 1 | S1 | 1 | Fail | S2 | 1 | Pass |
| | 2 | 1 | | | Fail | | | Pass |
| | 3 | 1 | | | Fail | | | Pass |
| | 4 | 1 | | | Fail | | | Pass |
| | 1 | 2 | | 2 | Pass | | 2 | Pass |
| | 2 | 2 | | | Pass | | | Pass |
| | 3 | 2 | | | Pass | | | Pass |
| | 4 | 2 | | | Pass | | | Pass |
| | 1 | 3 | | 3 | Pass | | 3 | Pass |
| | 2 | 3 | | | Pass | | | Pass |
| | 3 | 3 | | | Pass | | | Pass |
| | 4 | 3 | | | Pass | | | Pass |
| | 1 | 4 | | 4 | Pass | | 4 | Pass |
| | 2 | 4 | | | Pass | | | Pass |
| | 3 | 4 | | | Pass | | | Pass |
| | 4 | 4 | | | Pass | | | Pass |

| Result(1st) | | | | | X |
|---|---|---|---|---|---|
| DUT#4 | Pass | Pass | Pass | Pass | 4 |
| DUT#3 | Pass | Pass | Pass | Pass | 3 |
| DUT#2 | Pass | Pass | Pass | Pass | 2 |
| DUT#1 | Fail | Fail | Fail | Fail | 1 |
| Y | 1 | 2 | 3 | 4 | |

FIG. 12

| Result(2nd) | | | | | X |
|---|---|---|---|---|---|
| DUT#4 | Pass | Pass | Pass | Pass | 4 |
| DUT#3 | Pass | Pass | Pass | Pass | 3 |
| DUT#2 | Pass | Pass | Pass | Pass | 2 |
| DUT#1 | Pass | Pass | Pass | Pass | 1 |
| Y | 1 | 2 | 3 | 4 | |

FIG. 13

| Result(2nd) | | | | | X |
|---|---|---|---|---|---|
| DUT#4 | Pass | Pass | Pass | Pass | 4 |
| DUT#3 | Pass | Pass | Pass | Pass | 3 |
| DUT#2 | Pass | Pass | Pass | Pass | 2 |
| DUT#1 | Fail | Fail | Fail | Fail | 1 |
| Y | 1 | 2 | 3 | 4 | |

FIG. 14

| Test sequence | Measuring stage | | | |
|---|---|---|---|---|
| | No.1 | No.2 | No.3 | No.4 |
| 1 | W01 | W02 | W03 | W04 |
| 2 | W05 | W06 | W07 | W08 |
| 3 | W09 | W10 | X01 | X02 |
| 4 | X03 | X04 | X05 | Blank |

FIG. 15

| Test sequence | Measuring stage | | | |
|---|---|---|---|---|
| | No.1 | No.2 | No.3 | No.4 |
| 1 | W01 | W02 | W03 | W04 |
| 2 | W02 | Blank | W05 | W06 |
| 3 | W07 | Blank | W08 | W09 |
| 4 | W10 | Blank | X01 | X02 |
| 5 | X03 | Blank | X04 | X05 |

FIG. 16

| Test sequence | Measuring stage | | | |
|---|---|---|---|---|
| | No.1 | No.2 | No.3 | No.4 |
| 1 | W01 | W02 | W03 | W04 |
| 2 | W02 | Blank | W05 | W06 |
| 3 | W07 | W08 | W09 | W10 |
| 4 | X01 | X02 | X03 | X04 |
| 5 | X05 | Blank | Blank | Blank |

FIG. 18

| Test sequence | Measuring stage | | | |
|---|---|---|---|---|
| | No.1 | No.2 | No.3 | No.4 |
| 1 | W01 | W02 | X01 | X02 |
| 2 | W03 | W04 | X03 | X04 |
| 3 | W05 | W06 | X05 | Blank |
| 4 | W07 | W08 | Blank | Blank |
| 5 | W09 | W10 | Blank | Blank |

FIG. 19

| Test sequence | Measuring stage | | | |
|---|---|---|---|---|
| | No.1 | No.2 | No.3 | No.4 |
| 1 | W01 | W02 | W03 | Blank |
| 2 | W04 | W05 | W06 | W01 |
| 3 | W07 | W08 | W09 | W02 |
| 4 | W10 | X01 | X02 | W03 |
| 5 | X03 | X04 | X05 | W04 |
| 6 | Blank | Blank | Blank | W05 |
| 7 | Blank | Blank | Blank | W06 |
| 8 | Blank | Blank | Blank | W07 |
| 9 | Blank | Blank | Blank | W08 |
| 10 | Blank | Blank | Blank | W09 |
| 11 | Blank | Blank | Blank | W10 |
| 12 | Blank | Blank | Blank | X01 |
| 13 | Blank | Blank | Blank | X02 |
| 14 | Blank | Blank | Blank | X03 |
| 15 | Blank | Blank | Blank | X04 |
| 16 | Blank | Blank | Blank | X05 |

PROBE DEVICE, PROCESSING DEVICE, AND PROBE TESTING METHOD

CROSS-REFERENCE TO RELATED APPLICATIONS

This application is based upon and claims the benefit of priority from the prior Japanese Patent Application No. 2008-318416, filed on Dec. 15, 2008; the entire contents of which are incorporated herein by reference.

BACKGROUND OF THE INVENTION

1. Field of the Invention

The present invention relates to a probe device, a processing device, and a probe testing method.

2. Description of the Related Art

Conventionally, there is a known semiconductor processing system provided with plural devices for performing a wafer probe test of a semiconductor wafer by a probe card (see, for example, JP-A 2003-332189 (KOKAI)). The devices for performing the wafer probe test of this system are disposed at mutually different positions. In such system, when one of the devices is broken, the semiconductor wafer on the probe test and semiconductor wafers stand-by for it are carried to the other device(s). It takes a long time to rearrange the semiconductor wafers and convey them to the other devices, and the wafer probe test cannot be performed efficiently.

BRIEF SUMMARY OF THE INVENTION

The present invention provides a probe device, a processing device and a probe testing method that can perform an efficient wafer probe test.

According to an aspect of the present invention, there is provided a probe device comprising a plurality of measuring stages to which a plurality of probe cards for inspecting semiconductor wafers are connected, respectively; a first conveying portion for conveying a semiconductor wafer to a first measuring stage to which a first probe card is connected; a first inspection control portion for controlling the inspection of the semiconductor wafer by the first probe card; a receiving portion for receiving stage information including information showing nonuse of the first measuring stage from a processing device; a second conveying portion for conveying the semiconductor wafer to a second measuring stage, to which a second probe card different from the first probe card is connected, according to the received stage information; and a second inspection control portion for controlling the inspection of the semiconductor wafer by the second probe card.

According to an aspect of the present invention, there is provided a processing device which is connected to a probe device to which connected are a plurality of probe cards for inspecting semiconductor wafers and a test device for performing the inspection, comprising a first receiving portion for receiving ?the first inspection result? from the probe device and/or the test device; a first judgment portion for judging the use/nonuse of the probe cards according to the first inspection results; a transmission portion for transmitting information indicating the probe cards judged as nonuse and/or the measuring stages corresponded with the probe cards to the probe device; a second receiving portion for receiving the second inspection results from the probe device and/or the test device; and a second judgment portion for determination or release of the judgment of nonuse on the probe cards and/or the measuring stages according to the first and second inspection results.

According to an aspect of the present invention, there is provided a probe testing method for inspecting a semiconductor wafer, comprising conveying a semiconductor wafer to a first measuring stage to which a first probe card is connected; inspecting the semiconductor wafer by the first probe card; judging use/nonuse of a probe card according to the first inspection result; conveying the semiconductor wafer to a second measuring stage to which connected is a second probe card different from the probe card judged as nonuse; and inspecting the semiconductor wafer by the second probe card.

BRIEF DESCRIPTION OF THE DRAWINGS

FIG. 2A is a conceptual view showing information on semiconductor wafers to be inspected by the semiconductor processing system 1.

FIG. 2B is a conceptual view showing information on semiconductor wafers to be inspected by the semiconductor processing system 1.

FIG. 4 is a conceptual view of wafer probe results showing the results of the wafer probe test.

FIG. 5 is a functional block diagram of a tester 300a.

FIG. 7 is a conceptual view showing a measuring stage 220 usable for the wafer probe test.

FIG. 8 is a conceptual view showing wafer probe results and/or wafer probe test results stored in a storage portion 420.

FIG. 12 is a conceptual view collectively showing an example of wafer probe results of a retest of each of DUT#1 to DUT#4.

FIG. 13 is a conceptual view collectively showing another example of the wafer probe results of a retest of each of DUT#1 to DUT#4.

FIG. 14 is a conceptual view showing a conveying sequence of semiconductor wafers to individual measuring stages 220 if there is no semiconductor wafer to be retested as a wafer probe test result.

FIG. 15 is a conceptual view showing an example of the conveying sequence of semiconductor wafers to individual measuring stages 220 when the performance of a retest of wafer W02 is decided.

FIG. 16 is a conceptual view showing another example of the conveying sequence of the semiconductor wafers to the individual measuring stages 220 when the performance of the retest of wafer W02 is decided.

FIG. 18 is a conceptual view showing another example of the conveying sequence of the semiconductor wafers to the individual measuring stages 220.

FIG. 19 is a conceptual view showing another example of the conveying sequence of the semiconductor wafers to the individual measuring stages 220.

DETAILED DESCRIPTION OF THE INVENTION

First Embodiment

Figure 1:
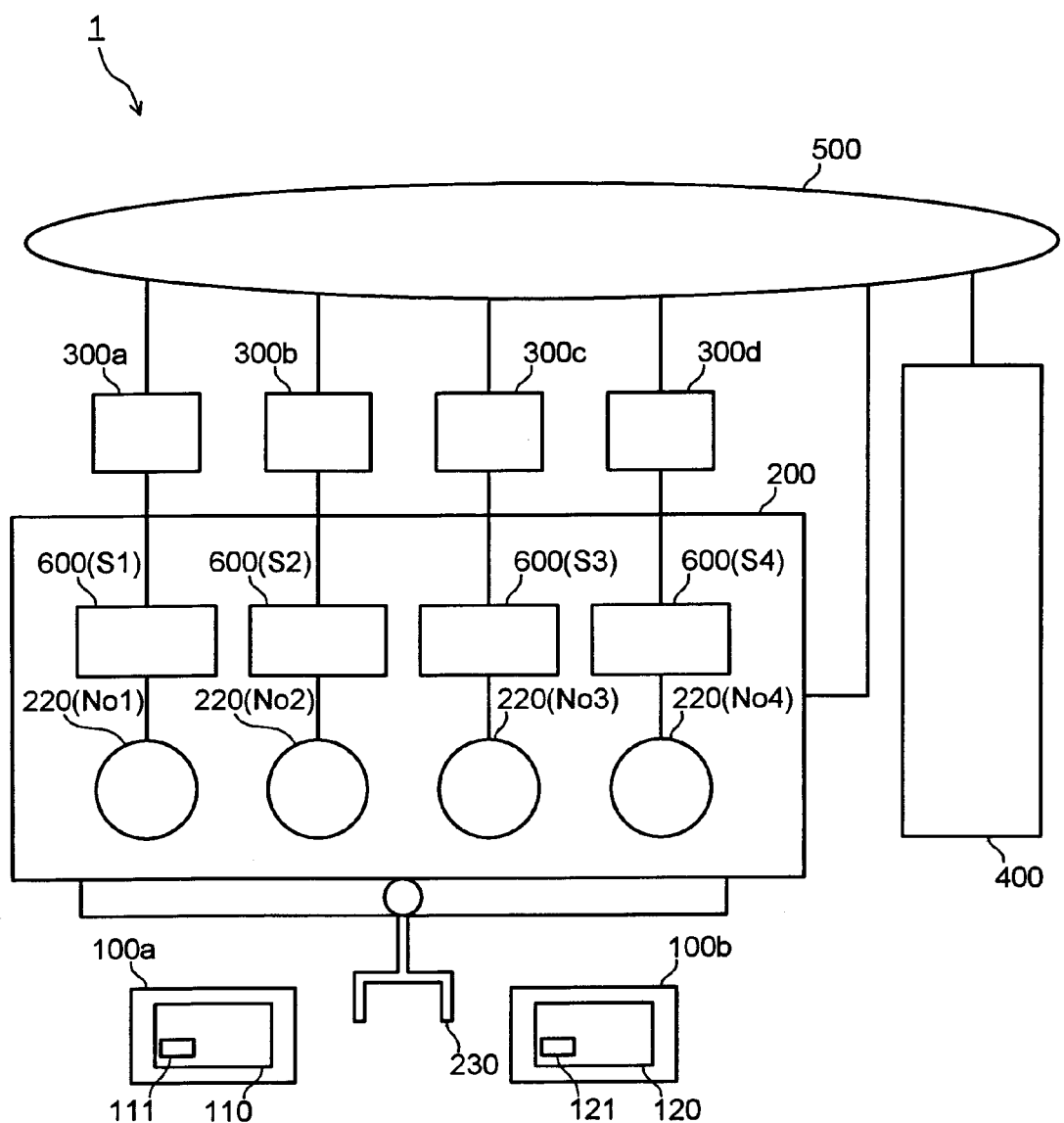
FIG. 1 is a block diagram showing a semiconductor processing system 1.

The semiconductor processing system 1 according to one embodiment of the present invention is described in detail below with reference to FIG. 1, FIG. 2A and FIG. 2B. FIG. 1 is a block diagram showing a structure of the semiconductor processing system 1. FIG. 2A and FIG. 2B are conceptual views showing information on semiconductor wafers to be inspected by the semiconductor processing system 1.

As shown in FIG. 1, the semiconductor processing system 1 is provided with load ports 100a, 100b, a probe device 200, testers 300a to 300d, a processing device 400 and probe cards 600. The semiconductor processing system 1 is occasionally provided with a display portion for showing characters and an input portion such as a keyboard for entering information.

The probe device 200, the testers 300a-300d and the processing device 400 are connected over a network 500 (such as LAN). The processing device 400 can also be provided with the structures and functions of the probe device 200 and/or the testers 300.

The load ports 100a, 100b are connected with pods 110, 120 in which plural semiconductor wafers are stored. The semiconductor wafer is occasionally called DUT (Device Under Test: object to be measured). Plural semiconductor chips (element regions) are formed on the semiconductor wafer.

The plural semiconductor chips are distinguished between a good-quality product and a defective product by the testers 300a-300d and the probe device 200. An electrical test to be performed on the semiconductor chips in order to distinguish between a good-quality product and a defective product is called a wafer probe test. The wafer probe test is separately performed on a predetermined number of semiconductor chips. It is separately performed four times in this embodiment. Namely, the wafer probe test of a single semiconductor wafer is completed by testing four times.

The plural probe cards 600 are provided with plural needles (probes). When the plural probe cards 600 are separately indicated below, a probe card 600 (S1) to a probe card 600 (S4) are used. The plural probe cards 600 each are provided with an identification ID for discrimination among them. The identification ID of the probe card 600 functions as a first identifier.

At the time of the wafer probe test, the plural needles of the probe cards 600 are contacted to the plural terminals (for example, electrode pads, bonding pads) formed on the semiconductor chips.

The semiconductor chips to which the plural needles are contacted are determined in advance. The plural needles are grouped into DUT#1 to DUT#4, respectively. The semiconductor chips to which the plural needles are contacted are represented by a two-dimensional coordinate. Namely, the semiconductor chips which are contacted to the DUT#1 are represented by coordinates (1, 1) to (4, 1). The semiconductor chips which are contacted to the DUT#2 are represented by coordinates (1, 2) to (4, 2). The semiconductor chips which are contacted with the DUT#3 are represented by coordinates (1, 3) to (4, 3). The semiconductor chips which are contacted with DUT#4 are represented by coordinates (1, 3) to (4, 3).

The pods 110, 120 are provided with storage portions 111, 121. As shown in FIG. 2A and FIG. 2B, information indicating lots, processes, kinds and wafer IDs ("LOT", "Process", "Kind" and "Wafer" in the drawing) of the semiconductor wafers housed in the pods 110, 120 is previously stored in the storage portions 111, 121. The information indicating lots, processes, kinds and wafer IDs is called semiconductor wafer information. The semiconductor wafer information can be rewritten appropriately by the probe device 200 or the processing device 400.

The "LOT" indicates a lot of the semiconductor wafers housed in the pods 110, 120. The "process" indicates the current process of the semiconductor wafers housed in the pods 110, 120. The "kind" indicates a kind of the semiconductor wafers housed in the pods 110, 120. The "wafer ID" is used to identify the individual semiconductor wafers housed in the pods 110, 120.

Information on only one of the wafer ID, the process and the kind of the semiconductor wafers is sometimes stored in the storage portions 111, 121. Even if the pods 110, 120 are not provided with the storage portions 111, 121, the semiconductor wafer information can be inputted by an input means such as a keyboard. The inputted semiconductor wafer information is held by the probe device 200.

Figure 3:
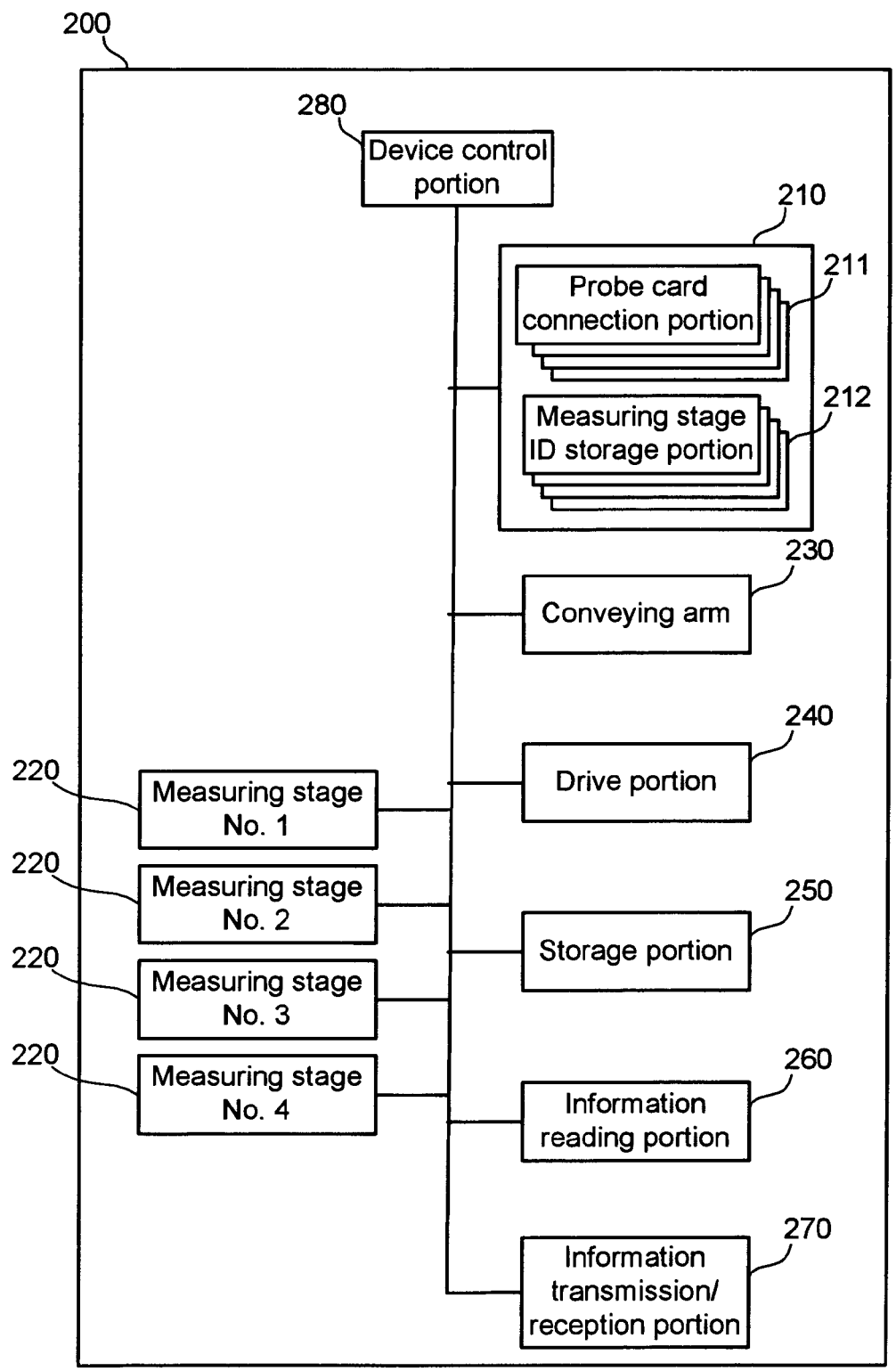
FIG. 3 is a block diagram showing a structure of a probe device 200.

The probe device 200 is described below with reference to FIG. 3 and FIG. 4. FIG. 3 is a block diagram showing a structure of the probe device 200. FIG. 4 is a conceptual view of the wafer probe result showing the results of the wafer probe test.

As shown in FIG. 3, the probe device 200 is provided with a probe card mounting portion 210, plural measuring stages 220, a conveying arm 230, a drive portion 240, a storage portion 250, an information reading portion 260, an information transmission/reception portion 270 and a device control portion 280.

The probe card mounting portion 210 is provided with plural probe card connection portions 211 and plural measuring stage ID storage portions 212.

The plural probe card connection portions 211 are corresponded with the plural measuring stages 220 on a one to one basis.

The probe card 600 (S1) to the probe card 600 (S4) are connected to the plural probe card connection portions 211, respectively. Output from the semiconductor chip is outputted to the device control portion 280 via the probe card connection portions 211. A performance board is occasionally connected to the probe card connection portions 211.

The "performance board" is an adaptor for electrical connection between the probe cards 600 and the probe card connection portions 211. Namely, the probe cards 600 are occasionally connected to the probe card connection portions 211 via the performance boards. The performance board is occasionally provided with a storage portion which stores the identification ID for identifying the performance board.

The plural measuring stage ID storage portions 212 are corresponded with the plural probe card connection portions 211 on a one to one basis. The measuring stage identification IDs for identifying the plural measuring stages 220 are stored in the measuring stage ID storage portions 212. The measuring stage identification IDs function as a second identifier. The measuring stage identification IDs are read by the information reading portion 260 and stored in the storage portion 250.

The plural measuring stages 220 are stages on which the semiconductor wafer is positioned. When the plural measuring stages 220 are individually indicated below, the measuring stage 220 (No. 1) to the measuring stage 220 (No. 4) are used. The semiconductor wafers removed from the pods 110, 120 are sequentially conveyed onto the measuring stages 220. The wafer probe test is performed on the semiconductor wafers conveyed onto the measuring stages 220.

The conveying arm 230 conveys the semiconductor wafers to the individual measuring stages 220.

The drive portion 240 moves the probe card mounting portion 210 vertically and/or horizontally. Therefore, the probe card 600 connected to the probe card mounting portion 210 is moved vertically and/or horizontally. Thus, the plural needles provided on the probe cards 600 can be contacted appropriately to the electrodes on the semiconductor chips at the time of the wafer probe test.

The storage portion 250 stores previously firmware for controlling the operation of the drive portion 240. The storage portion 250 stores therein identification IDs for identifying the semiconductor wafer information, the probe cards 600 (S1) to 600 (S4) and the identification IDs of the measuring stages 220 (No. 1) to 240 (No. 4). The storage portion 250 occasionally stores the identification ID of the probe device 200 and the identification ID of the performance board. The storage portion 250 stores information indicating whether the wafer probe test is performed on the semiconductor wafers of each lot, each process or each kind. It is determined in this embodiment that information indicating that the wafer probe test is performed on each lot is stored.

The information reading portion 260 reads the identification IDs of the probe cards 600 and the identification IDs of the measuring stages 220 via the probe card mounting portion 210. The information reading portion 260 causes the storage portion 250 to hold the read identification IDs of the probe cards 600 and the identification IDs of the measuring stages 220 in correspondence with each other.

For example, the probe card 600 (S1) and the measuring stage 220 (No. 1), the probe card 600 (S2) and the measuring stage 220 (No. 2) . . . are corresponded with each other. As a result, a correspondence relationship among the probe card 600 (S1) to the probe card 600 (S4) and the measuring stage 220 (No. 1) to the measuring stage 220 (No. 4) can be specified.

The information reading portion 260 reads occasionally the identification ID of the performance board. In such a case, the read identification IDs of the probe cards 600, the identification IDs of the measuring stages 220 and the identification IDs of the performance boards are correspondingly stored in the storage portion 250.

The information transmission/reception portion 270 is a communication interface for transmission and reception of information with the processing device 400 and the testers 300.

The device control portion 280 receives various kinds of information from the processing device 400 via the information transmission/reception portion 270. For example, it is information indicating the measuring stage 220 not used in the wafer probe test. The "information indicating the measuring stage 220 not used in the wafer probe test" is decided according to, for example, a process or a kind of the semiconductor wafer, an occurrence of an error in the wafer probe test, or the like.

The device control portion 280 controls the conveying arm 230, the drive portion 240 and the like. The device control portion 280 stops temporarily the conveying arm 230 from conveying the semiconductor wafers in response to placement of the semiconductor wafers on the measuring stages 220.

The device control portion 280 controls the conveying arm 230 to exchange the semiconductor wafers after the wafer probe test is completed (after the first inspection). Specifically, the device control portion 280 exchanges the semiconductor wafer undergone the wafer probe test and a semiconductor wafer not undergone the wafer probe test. The wafer probe test which is performed on the exchanged semiconductor wafer is a second inspection.

The device control portion 280 conveys occasionally the tested semiconductor wafer to another measuring stage 220. For example, it is a semiconductor wafer which is judged to be retested as a result of the wafer probe test. The retest is a part of the second inspection.

The output from the semiconductor chip is inputted into the device control portion 280 via the probe card mounting portion 210. The device control portion 280 outputs to the tester 300 the output from the semiconductor chip inputted via the information transmission/reception portion 270. At this time, the device control portion 280 can add the identification ID of the probe card 600, the identification ID of the semiconductor wafer and the like to the output.

The device control portion 280 judges whether or not the output of the semiconductor chip is normal or not according to the output from the semiconductor chip. The device control portion 280 generates information (hereinafter called "wafer probe result") including a judgment result of the output from the semiconductor chip for every semiconductor wafer, and outputs to the processing device 400.

As shown in FIG. 4, the wafer probe results have the identification ID of the probe card, the identification ID of the wafer, the addresses, the transmission sequence, the addresses, DUT numbers and test results (corresponded with "Card", "Wafer", "Transmission sequence", "Address", "DUT" and "Result" in the drawing) corresponded with one another.

The "identification ID of probe card" (Card) is an identification ID of the probe card 600 which is read by the information reading portion 260 and stored in the storage portion 250.

The "identification ID of wafer" (Wafer) is an identification ID of the semiconductor wafer which is read by the information reading portion 260 and stored in the storage portion 250.

The "transmission sequence" indicates a sequence of "test results" which are transmitted to the processing device 400 at one time. The "transmission sequence" is corresponded with the wafer probe result to make the description clearly understandable. Therefore, the "transmission sequence" is reasonable even if it is not corresponded with the wafer probe results.

The "address" indicates the coordinates of the semiconductor chip which was undergone the wafer probe test. The "DUT number (DUT)" indicates grouping of plural needles provided to the probe cards 600.

The "test result" (Result) indicates the wafer probe test results. Here, when the wafer probe test is completed normally, it is indicated by "Pass", and when not completed normally, it is indicated by "Fail". The "test result (Result)" is added with information indicating the number of times of wafer probe tests (for example, "Result (1st)" in the drawing). And, it is indicated by "Result (2nd)" at the time of the retest of the wafer probe test.

The wafer probe result is occasionally added with the identification ID of the performance board.

As described above, the probe device 200 in this embodiment is provided with the plural measuring stages 220 and can convey the semiconductor wafer which requires the retest of the wafer probe test to another measuring stage 220.

Figure 5:
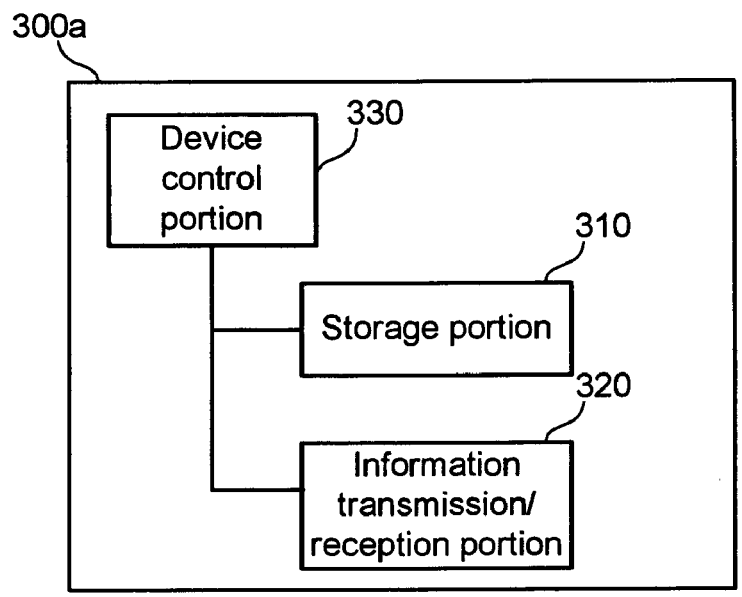

The testers 300a to 300d are described below with reference to FIG. 5. FIG. 5 is a functional block diagram of the tester 300a.

The testers 300a to 300d are corresponded with the measuring stage 220 (No. 1) to the measuring stage 220 (No. 4), respectively. The testers 300a to 300d perform the wafer probe test on the semiconductor wafers which are conveyed to the measuring stage 220 (No. 1) to the measuring stage 220 (No. 4).

The testers 300a to 300d are provided with substantially the same structure and function, respectively. Therefore, the tester 300a is described below in detail, and detailed descriptions of the testers 300b to 300d will be omitted.

As shown in FIG. 5, the tester 300a is provided with a storage portion 310, an information transmission/reception portion 320 and a device control portion 330.

The storage portion 310 stores in advance a program and the like for performing the wafer probe test.

The information transmission/reception portion 320 is a communication interface for transmission and reception of information between the processing device 400 and the probe device 200.

The device control portion 330 receives a signal indicating the start of the wafer probe test, the identification ID of the probe card, the identification ID of the semiconductor wafer, the output from the semiconductor chip and the like from the probe device 200 via the information transmission/reception portion 320.

The device control portion 330 reads the program stored in the storage portion 310 upon receiving the information indicating the start of the wafer probe test. According to the read program, the device control portion 330 transmits a control command to the probe device 200 via the information transmission/reception portion 320. This control program supplies for example a predetermined value of electric current to the semiconductor chip.

The device control portion 330 receives occasionally a signal indicating a stop of the wafer probe test from the probe device 200 or the processing device 400 via the information transmission/reception portion 320. The device control portion 330 stops the wafer probe test upon receiving the signal indicating the stop of the wafer probe test.

The device control portion 330 judges whether or not the output of the received semiconductor chip is normal. The device control portion 330 generates information (hereinafter called "wafer probe test result") including the judgment result of the output of the semiconductor chip and outputs it to the processing device 400. The wafer probe test result is substantially the same as the wafer probe result which is transmitted from the probe device 200 to the processing device 400 (see FIG. 4). For example, when the processing device 400 could not receive normally the wafer probe result transmitted from the probe device 200, the wafer probe test result is handled as data instead of the wafer probe result.

Figure 6:
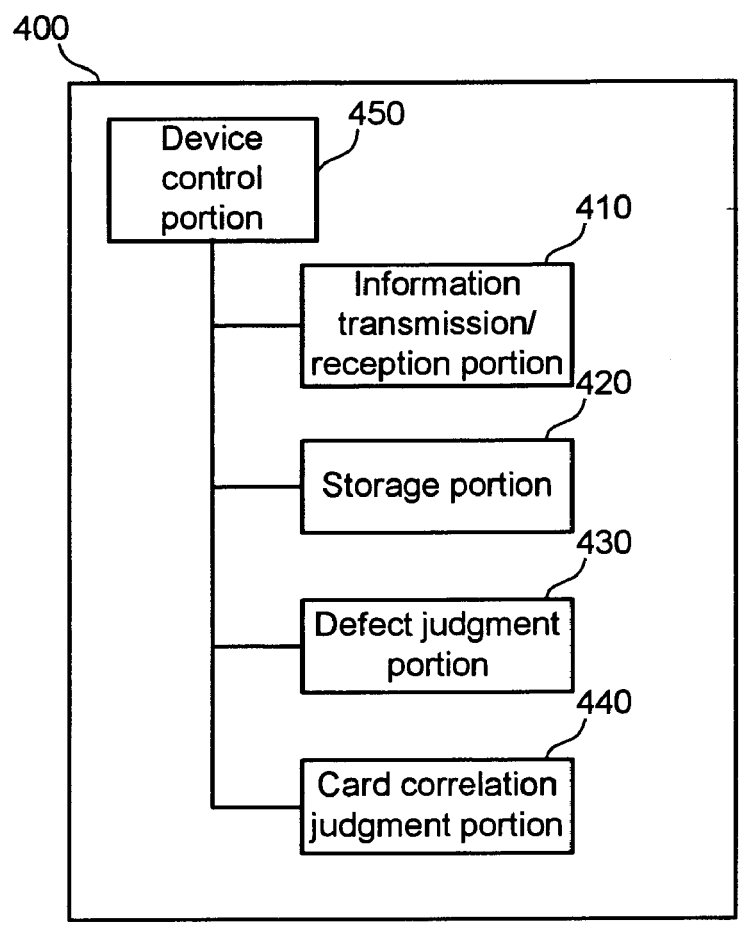
FIG. 6 is a block diagram showing a structure of a processing device 400.

The processing device 400 is described below with reference to FIG. 6 to FIG. 8. FIG. 6 is a block diagram showing a structure of the processing device 400. FIG. 7 is a conceptual view showing the measuring stages 220 usable in the wafer probe test. FIG. 8 is a conceptual view showing the wafer probe results and/or wafer probe test results stored in the storage portion 420.

As shown in FIG. 6, the processing device 400 is provided with an information transmission/reception portion 410, a storage portion 420, a defect judgment portion 430, a card correlation judgment portion 440 and a device control portion 450.

The information transmission/reception portion 410 is a communication interface for transmission and reception of information with the probe device 200 and the testers 300.

The various kinds of information received via the information transmission/reception portion 410 are stored in the storage portion 420. For example, the storage portion 420 stores the identification ID of the probe card 600 which is not usable by the probe device 200 or stores the wafer probe results and/or the wafer probe test results.

As shown in FIG. 7, the measuring stages 220 usable in the wafer probe test of the semiconductor wafers of each process or each kind are stored previously in the storage portion 420.

The defect judgment portion 430 judges the presence or not of a defect in the probe cards 600 with reference to the wafer probe result and/or the wafer probe test result. It is not limited particularly which of the wafer probe result or the wafer probe test result is referred to. In this embodiment, a case of referring to the wafer probe result is described.

The card correlation judgment portion 440 performs determination or release of the judgment made by the defect judgment portion 430. The card correlation judgment portion 440 transmits information indicating the determination or release of the judgment result made by the defect judgment portion 430 to the device control portion 450.

The device control portion 450 receives the identification IDs of the measuring stages 220 and the probe cards 600 transmitted from the probe device 200. The device control portion 450 receives the semiconductor wafer information and wafer probe result transmitted from the probe device 200. Besides, the device control portion 450 receives the wafer probe test results transmitted from the testers 300. The device control portion 450 causes the storage portion 420 to hold the received information temporarily.

The device control portion 450 judges a stop or a pause of the wafer probe test, a skip of the test and the like.

The device control portion 450 transmits a signal indicating the start of the wafer probe test to the probe device 200.

The device control portion 450 reads "information on the measuring stage 220 usable at the time of the wafer probe test of each process or kind of the semiconductor wafer" stored in the storage portion 420. Specifically, the device control portion 450 reads information from the storage portion 420 according to the semiconductor wafer information transmitted from the probe device 200 at the time of the wafer probe test. The device control portion 450 transmits the received "information on the measuring stage 220 usable at the time of the wafer probe test of the semiconductor wafers of each process or kind" to the probe device 200.

The device control portion 450 judges occasionally a nonuse measuring stage 220 at the time of the wafer probe test. For example, the identification ID of the probe card 600 transmitted from the probe device 200 and the identification ID of the probe card 600 unusable by the probe device 200 stored in the storage portion 420 are compared for judgment.

The device control portion 450 decides a retest of the semiconductor wafer on the measuring stage 220 which is corresponded with the probe card 600 which is judged to be defective by the defect judgment portion 430 after the wafer probe test is terminated. At this time, the device control portion 450 decides the nonuse of the measuring stage 220 which is corresponded with the probe card 600 which is judged to be defective by the defect judgment portion 430. The device control portion 450 transmits a signal indicating a stop of the wafer probe test to any of the testers 300a to 300d corresponded with the measuring stages 220 of which nonuse is decided.

The device control portion 450 generates stage information which corresponds the identification ID of the measuring stage 220 of which nonuse is decided with information indicating nonuse. The device control portion 450 transmits the generated stage information to the probe device 200.

At this time, the device control portion 450 can also transmit to the probe device 200 the identification ID of the measuring stage 220 where the semiconductor wafer of which retest is decided is present, the identification ID of the measuring stage 220 where the retest is performed and information indicating the retest in correspondence to the stage information. The identification ID of the measuring stage of the retest destination is, for example, that of an adjacent measuring stage 220.

As shown in FIG. 8, the device control portion 450 causes the storage portion 420 to hold the wafer probe results and/or the wafer probe test results held by the storage portion 420 in correspondence to the wafer probe results and/or the wafer probe test results received at the time of the retest. The card correlation judgment portion 440 refers to the corresponded wafer probe results.

As described above, the processing device 400 controls the probe device 200, the testers 300 and the like to perform processing for execution or nonexecution of the wafer probe test, for retesting the wafer probe test, for judging a defect of the probe card, or for determining or releasing the judgment of a defect.

Defect judgment of the probe card 600 by the defect judgment portion 430 is described below with reference to FIG. 9 and FIG. 10.

Figures 9, 10:
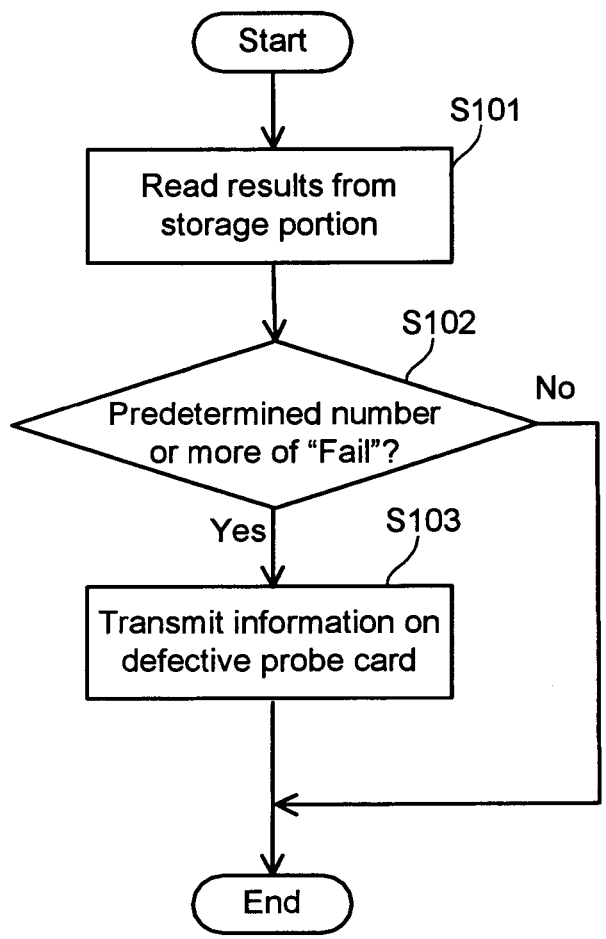
FIG. 9 is a flowchart showing judgment of a defect of a probe card 600 by a defect judgment portion 430.
FIG. 10 is a conceptual view collectively showing first wafer probe results of each of DUT#1 to DUT#4.

FIG. 9 is a flowchart showing judgment of a defect of the probe card 600 by the defect judgment portion 430. FIG. 10 is a conceptual view collectively showing first wafer probe results for each of DUT#1 to DUT#4.

(1) Reading of Wafer Probe Results (Step S101)
As shown in FIG. 9, the defect judgment portion 430 reads the wafer probe results and/or the wafer probe test results stored in the storage portion 420 to perform defect judgment of the probe card 600.

(2) Defect Judgment (Step S102)
If information of "Result (1st)" of any of DUT#1 to DUT#4 has all "Fail" (see FIG. 10), the defect judgment portion 430 judges that the probe card 600 is defective. If a predetermined or more (for example, about 60 to 90%) of "Result (1st)" is "Fail" among information of "Result (1st)" of any of DUT#1 to DUT#4, the defect judgment portion 430 judges sometimes that the probe card 600 is defective.

(3) Transmission of Judgment Result (Step S103)
The defect judgment portion 430 transmits the judgment result to the device control portion 450 and terminates the defect judgment processing.

Figure 11:
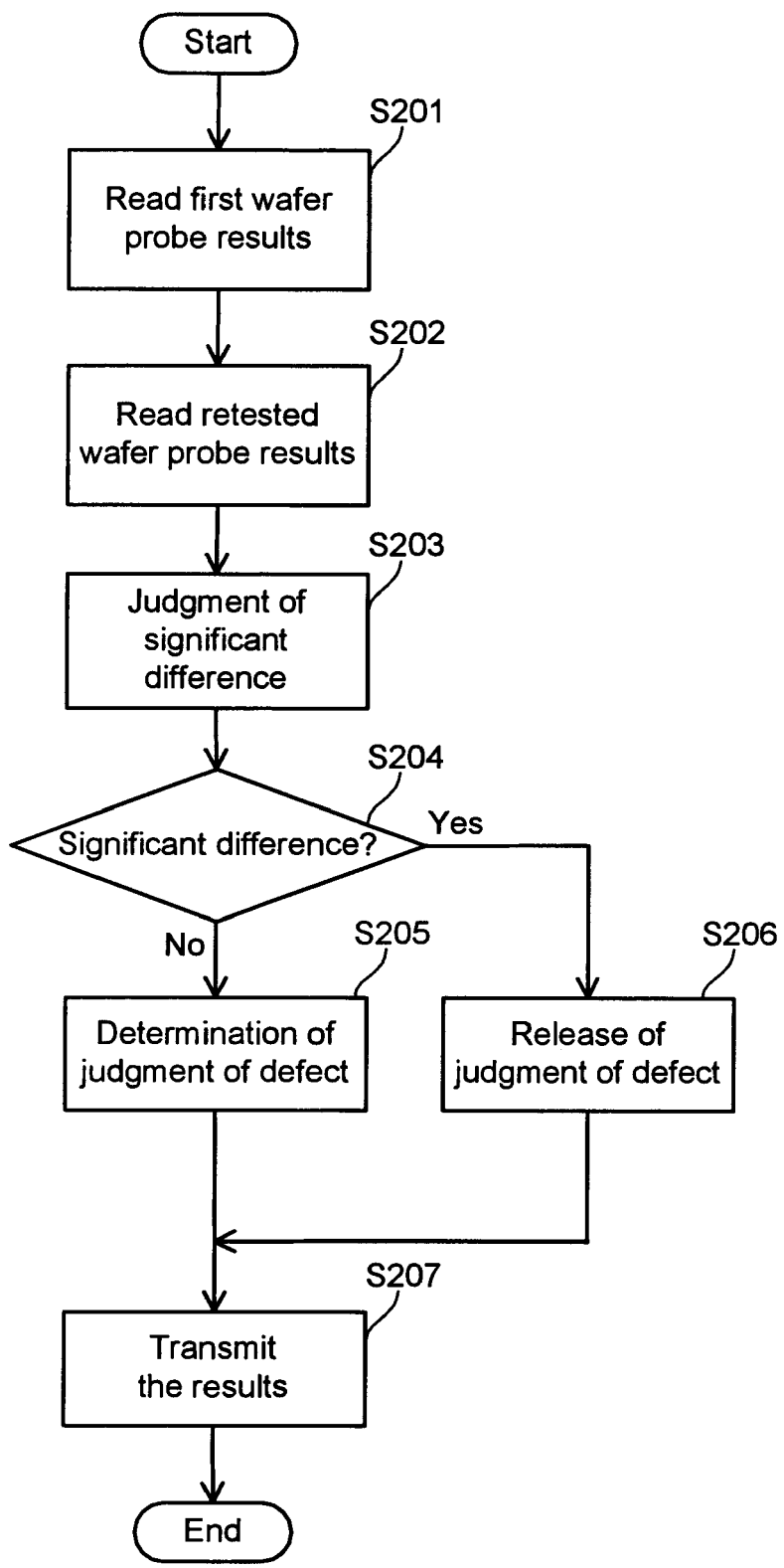
FIG. 11 is a flowchart showing an operation for defect judgment of a probe card 600 (S1) by a card correlation judgment portion 440.

An operation for determination or release of the defect judgment by the card correlation judgment portion 440 is described below with reference to FIG. 11 to FIG. 13. FIG. 11 is a flowchart showing an operation for defect judgment of the probe card 600 (S1) by the card correlation judgment portion 440. FIG. 12 is a conceptual view collectively showing an example of the wafer probe results for each of DUT#1 to DUT#4 at the time of retest. FIG. 13 is a conceptual view collectively showing another example of the wafer probe results at the time of retest of each of DUT#1 to DUT#4. The following description also refers to FIG. 10, if necessary.

Here, an example that the probe card 600 (S1) is judged as defective by the defect judgment portion 430 is described below.

(1) Reading of Wafer Probe Result (Steps S201, S202)
The card correlation judgment portion 440 reads the first wafer probe results of the probe card (S1) stored in the storage portion 420 and the wafer probe results of the probe card (S2) after the retest. At this time, the card correlation judgment portion 440 reads sometimes the wafer probe test results instead of the wafer probe results.

(2) Judgment of Significant Difference (Steps S203 to S206)
The card correlation judgment portion 440 compares the read wafer probe results and/or wafer probe test (steps S203, S204).

If the compared results show that all the chips which were "Fail" by the probe card 600 (S1) are "Pass" (see FIG. 10, FIG. 12), the card correlation judgment portion 440 determines a defect of the probe card 600 (S1) (step S205). Namely, it is highly possible that DUT#1 of the probe card 600 is out of order.

If the retest result of the probe card 600 (S2) shows that all the chips which were "Fail" by the probe card 600 (S1) were "Fail" (see FIG. 10, FIG. 13), the result is the same as that of the probe card 600 (S1), so that it is highly possible that DUT#1 of the probe card 600 (S1) is normal.

Namely, it is highly possible that the semiconductor chip of (1, 1) to (4, 1) of the semiconductor wafer W01 is a defective product.

In this case, the card correlation judgment portion 440 judges that the probe card 600 (S1) is operating normally and releases the judgment of a defect on the probe card 600 (S1) (step S206).

(3) Transmission of Judgment Result (Step S207)
The card correlation judgment portion 440 transmits information indicating determination or release of a defect to the device control portion 450.

The conveying sequence of semiconductor wafers to the individual measuring stages 220 is described below with reference to FIG. 14 to FIG. 16.

First, a conveying sequence of the semiconductor wafers to the individual measuring stages 220 when there is no retested semiconductor wafer as a result of the wafer probe test is described with reference to FIG. 14. FIG. 14 is a conceptual view showing a conveying sequence of the semiconductor wafers to the individual measuring stages 220 when there is no retested semiconductor wafer as a result of the wafer probe test.

A case that semiconductor wafers W01 to W10 of lot A are housed in the pod 110 and semiconductor wafers X01 to X05 of lot B are housed in the pod 120 is described below. The individual semiconductor wafers are of the same process and kind.

First, the conveying arm 230 conveys the semiconductor wafers W01 to W04, which are sequentially removed from the pod 110, to the measuring stage 220 (No. 1) to the measuring stage 220 (No. 4), respectively.

A first ("test number 1" in the drawing) wafer probe test is performed on the conveyed semiconductor wafers W01 to W04.

After the wafer probe test is completed, the conveying arm 230 exchanges the semiconductor wafers W01 to W04 on the measuring stages 220 and the semiconductor wafers W05 to W08 in the pod 110. Namely, the semiconductor wafers W05 to W08 sequentially removed from the pod 110 are conveyed sequentially to the measuring stage 220 (No. 1) to the measuring stage 220 (No. 4).

The wafer probe test is performed on the conveyed semiconductor wafers W05 to W08 ("test number 2" in the drawing).

The wafer probe test of the semiconductor wafers W05 to W08 is similarly completed, and the semiconductor wafers W05 to W08 and the semiconductor wafers W09 to X02 are exchanged. When the wafer probe test of the semiconductor wafers W09 to X02 is completed, the semiconductor wafers W09 to X02 and the semiconductor wafers X03 to X05 are exchanged. When the semiconductor wafers X03 to X05 are subjected to the wafer probe test, the measuring stage 220 (No. 4) is in a blank state ("test number 4" in the drawing).

As described above, the conveying arm 230 conveys the individual semiconductor wafers sequentially to the measuring stage 220 (No. 1) to the measuring stage 220 (No. 4).

An example of a conveying sequence of the semiconductor wafers to the individual measuring stages 220 when the execution of the retest of the wafer W02 is decided is described below with reference to FIG. 15. FIG. 15 is a conceptual view showing an example of a conveying sequence of semiconductor wafers to the individual measuring stages 220 when the execution of a retest of the wafer W02 is decided.

As an example, a case that a retest of the wafer W02 is decided as a result of the wafer probe test performed on the measuring stage 220 (No. 2) and nonuse of the measuring stage 220 (No. 2) is determined as a result of the retest performed on the measuring stage 220 (No. 1) is described below.

As shown in FIG. 15, the conveying arm 230 first conveys sequentially the semiconductor wafers W01 to W04, which are sequentially removed from the pod 110, to the measuring stage 220 (No. 1) to the measuring stage 220 (No. 4). The wafer probe test is performed on the conveyed semiconductor wafers W01 to W04 ("test number 1" in the drawing).

The wafer probe result of the semiconductor wafer W02 occasionally contains "Fail". In such a case, it is judged by the defect judgment portion of the processing device 400 that the probe card 600 (No. 2) having tested the semiconductor wafer W02 has a defect. Therefore, the device control portion 450 of the processing device 400 decides to temporarily suspend the use of the measuring stage 220 (No. 2) onto which the semiconductor wafer W02 is conveyed. Besides, the device control portion 450 decides a retest of the semiconductor wafer W02.

After the wafer probe test of the semiconductor wafers W01 to W04, the semiconductor wafer W02 decided to be retested is conveyed to the measuring stage 220 (No. 1). And, the semiconductor wafers W05, W06 taken out of the pod 110 are conveyed to the measuring stage 220 (No. 3) and the measuring stage 220 (No. 4). Nothing is conveyed to the measuring stage 220 (No. 2) which is decided to be temporarily nonuse by the device control portion 450.

The wafer probe test is performed on the measuring stage 220 (No. 1), the measuring stage 220 (No. 3) and the measuring stage 220 (No. 4) ("test number 2" in the drawing).

Here, the nonuse of the measuring stage 220 (No. 2) is sometimes not released depending on a result of the retest of the semiconductor wafer W02.

It is when the semiconductor chip, which was "Fail" by the first wafer probe test of the semiconductor wafer W02, was "Pass" as a result of the retest of the semiconductor wafer W02 on the measuring stage 220 (No. 1).

In this case, it is highly possible that the semiconductor chip on the semiconductor wafer W02 is a good-quality product, and the probe card 600 (No. 2) is defective. Therefore, the card correlation judgment portion 440 of the processing device 400 determines the defect of the probe card 600 (No. 2) which was judged by the defect judgment portion 430 in the first wafer probe test. Namely, the nonuse of the measuring stage (No. 2) to which the probe card 600 (No. 2) is connected is continued.

After that, the wafer probe test is performed up to the wafer X03 ("test numbers 3 to 5" in the drawing) by using the measuring stages 220 other than the measuring stage 220 (No. 2).

Another example of the conveying sequence of the semiconductor wafers to the individual measuring stages 220 when the performance of the retest of the wafer W02 is decided is described below with reference to FIG. 16. FIG. 16 is a conceptual view showing another example of the conveying sequence of the semiconductor wafers to the individual measuring stages 220 in the case where the retest of the wafer W02 is performed.

As an example, a case that a retest of the wafer W02 is decided as a result of the wafer probe test performed on the measuring stage 220 (No. 2) and nonuse of the measuring stage 220 (No. 2) is released as a result of the retest performed on the measuring stage 220 (No. 1) is described below.

As shown in FIG. 16, the conveying arm 230 first conveys sequentially the semiconductor wafers W01 to W04, which are sequentially removed from the pod 110, to the measuring stages 220. The wafer probe test is performed on the conveyed semiconductor wafers W01 to W04 ("test number 1" in the drawing).

The wafer probe result of the semiconductor wafer W02 occasionally contains "Fail". In such a case, it is judged by the defect judgment portion of the processing device 400 that the probe card 600 (No. 2) having tested the semiconductor wafer W02 has a defect. Therefore, the device control portion 450 of the processing device 400 decides to temporarily suspend the use of the measuring stage 220 (No. 2) onto which the semiconductor wafer W02 is conveyed. Besides, the device control portion 450 decides a retest of the semiconductor wafer W02.

After the wafer probe test of the semiconductor wafers W01 to W04, the semiconductor wafer W02 decided to be retested is conveyed to the measuring stage 220 (No. 1). And, the semiconductor wafers W05, W06 taken out of the pod 110 are conveyed to the measuring stage 220 (No. 3) and the measuring stage 220 (No. 4) respectively. Nothing is conveyed to the measuring stage 220 (No. 2) which is decided to be temporarily nonuse by the device control portion 450.

The wafer probe test is performed on the measuring stage 220 (No. 1), the measuring stage 220 (No. 3) and the measuring stage 220 (No. 4) ("test number 2" in the drawing).

Here, the nonuse of the measuring stage 220 (No. 2) is occasionally released depending on a result of the retest of the semiconductor wafer W02. It is when the semiconductor chip, which was "Fail" by the first wafer probe test of the semiconductor wafer W02, was "Fail" again as a result of the retest of the semiconductor wafer W02 on the measuring stage 220 (No. 1).

In this case, it is highly possible that the semiconductor chip on the semiconductor wafer W02 is a defective product, and the probe card 600 (No. 2) is normal. Therefore, the card correlation judgment portion 440 of the processing device 400 releases the defect of the probe card 600 (No. 2) which was judged by the defect judgment portion 430 in the first wafer probe test.

When the judgment of the defect on the probe card 600 (No. 2) is released, the conveyance of the semiconductor wafer to the measuring stage 220 (No. 2) is resumed. And, the remaining semiconductor wafers are sequentially conveyed to perform the wafer probe test ("test number 3" to "test number 5" in the drawing).

The wafer W02 which had an error as a result of the wafer probe test was retested on the measuring stage 220 (No. 1) but may be retested on another measuring stage 220.

Figure 17:
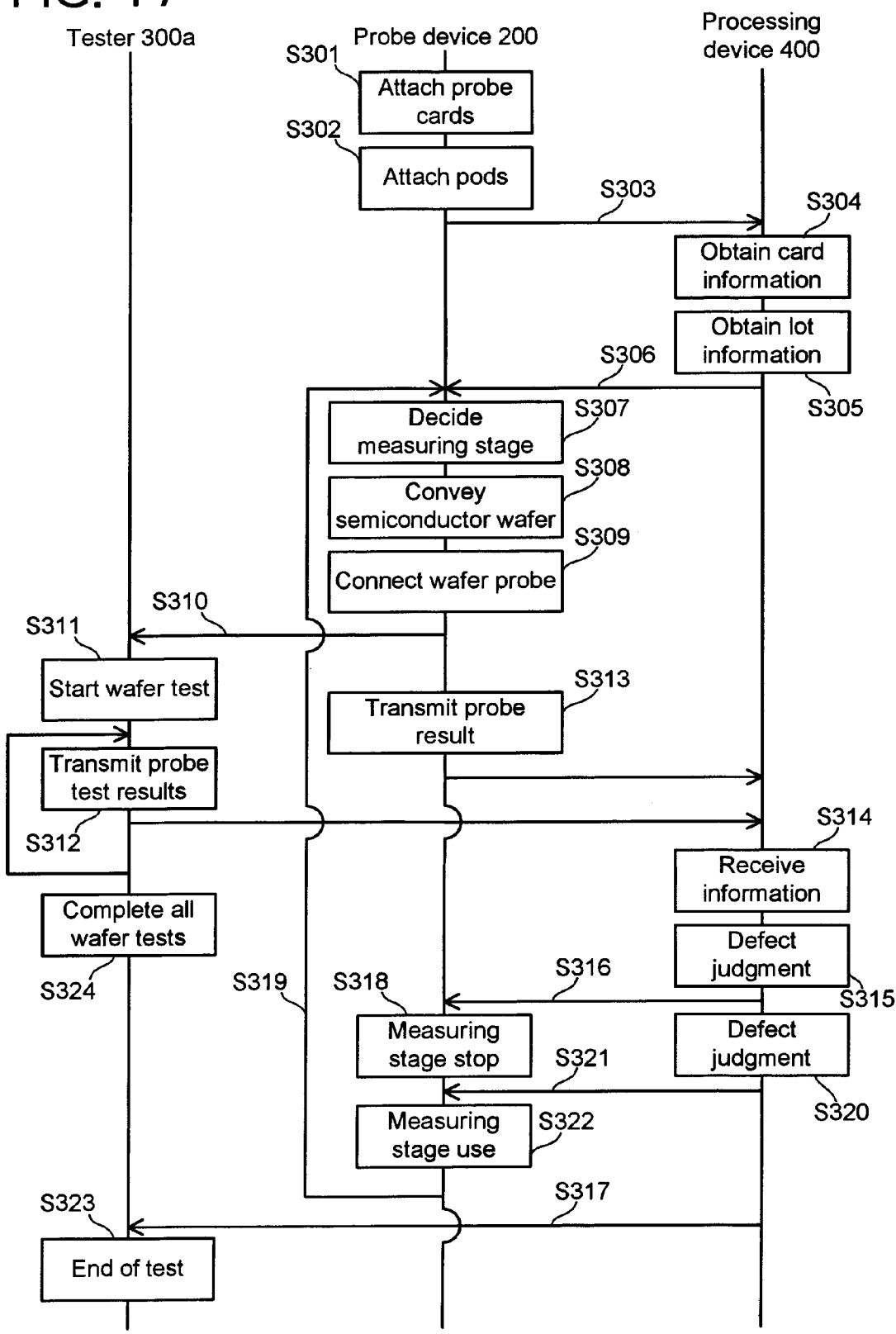
FIG. 17 is a sequence view showing an operation of the semiconductor processing system 1.

A processing method (probe testing method) of the wafer probe test by the semiconductor processing system 1 is described below with reference to FIG. 17. FIG. 17 is a sequence diagram showing an operation of the semiconductor processing system 1.

Since the tester 300a to the tester 300d have substantially the same function, structure and operation, only the tester 300a is described below.

(1) Preparation of Wafer Probe Test (Step S301)

First, the probe card 600 (S1) to the probe card 600 (S4) are attached to the plural probe card connection portions 211 respectively. A performance board and the like are also attached, if necessary.

Then, the information reading portion 260 reads the identification IDs of the measuring stage 220 (No. 1) to the measuring stage 220 (No. 4) and the probe card 600 (S1) to the probe card 600 (S4). Here, the information reading portion 260 reads occasionally the identification ID of the probe device 200 or the identification ID of the performance board.

(2) Attachment of Pods 110, 120 (Step S302)

Besides, the pods 110, 120 are connected to the load ports 100a, 100b respectively. The information reading portion 260 reads semiconductor wafer information from the pods 110, 120.

(3) Transmission/Reception of Identification ID (Step S303)

The device control portion 280 causes the storage portion 250 to hold the identification IDs of the measuring stage 220 (No. 1) to the measuring stage 220 (No. 4) in correspondence with the identification IDs of the probe card 600 (S1) to the probe card 600 (S4) read by the information reading portion 260. The device control portion 280 outputs the individual identification IDs and the semiconductor wafer information, which are corresponded with one another, to the processing device 400.

(4) Transmission/Reception of Information (Steps S304 to S306)

The device control portion 450 of the processing device 400 receives the individual identification IDs transmitted from the probe device 200 and the semiconductor wafer information via the information transmission/reception portion 410.

The device control portion 450 transmits information on the usable measuring stage 220 for the obtained semiconductor wafers of each process and kind to the probe device 200. At this time, the device control portion 450 occasionally judges according to the received individual identification IDs the measuring stage 220, which is not used at the time of the wafer probe test, and transmits to the probe device 200.

(5) Decision of Measuring Stage (Step S307)

The device control portion 280 of the probe device 200 determines the measuring stage 220 for performing the probe test according to the received information. This determination can also be performed by an operator. In a case where the operator determines the measuring stage 220, information on the usable measuring stage 220 transmitted from the processing device 400 (for example, characters corresponding to FIG. 7, characters indicating the individual measuring stage 220 (No. 1) to measuring stage 220 (No. 4), etc.) is displayed on a display portion. And, the measuring stage 220 for performing the probe test is decided by an input means such as a keyboard.

(6) Conveyance of Semiconductor Wafer (Step S308)

The device control portion 280 controls the conveying arm 230 to convey sequentially the semiconductor wafers to the measuring stage 220 (No. 1) to the measuring stage 220 (No. 4).

(7) Connection of Wafer Probe (Step S309)

When the semiconductor wafers are conveyed to the individual measuring stages 220, the device control portion 280 controls the drive portion 240 to contact the plural needles of the probe cards 600 to the semiconductor chips on the individual semiconductor wafers.

(8) Start of Wafer Probe Test (Steps S310, S311)

When the needles of the probe cards 600 are contacted to the semiconductor chips, a signal to start the wafer probe test is outputted from the device control portion 280 to the testers 300a to 300d (step S310).

Upon receiving the signal to start the wafer probe test, the device control portion 330 of the tester 300 reads the program for the wafer probe test stored in the storage portion 310 to start the wafer probe test.

(9) Transmission of Wafer Probe Test Result (Step S312)

Based on the outputs of the individual semiconductor chips received from the probe device 200, the device control portion 330 judges "Pass" or "Fail" of the individual semiconductor chips. The device control portion 330 outputs the judgment result as a wafer probe test result to the processing device 400.

(10) Transmission of Wafer Probe Result (Step S313)

At this time, the device control portion 280 of the probe device 200 judges "Pass" or "Fail" of the individual semiconductor chips according to the outputs of the individual semiconductor chips.

The device control portion 280 outputs the judgment result as a wafer probe result to the processing device 400.

(11) Reception of Information (Step S314)

The device control portion 450 of the processing device 400 receives the wafer probe test results from the testers 300 via the information transmission/reception portion 410. It also receives the wafer probe results from the probe device 200. The device control portion 450 causes the storage portion 420 to hold the received wafer probe test results and wafer probe results.

(12) Defect Judgment Processing (Step S315)

The defect judgment portion 430 of the processing device 400 judges a defect of the probe card with reference to the received wafer probe test results and/or wafer probe results. Specifically, the defect judgment portion 430 reads the wafer probe results and/or wafer probe test results of the first test with reference to the storage portion 420. The defect judgment portion 430 judges as a defect the probe card 600, which is corresponded with the wafer probe result having a given level or higher of "Fail", and transmits information indicating the judgment of a defect in correspondence with the identification ID of the probe card 600 to the device control portion 450.

(13) Transmission of Information (Step S316, S317)

The device control portion 450 reads the identification ID of the measuring stage 220 corresponding to the probe card 600 judged as defective to generate stage information having the read identification ID corresponded with information indicating nonuse. The device control portion 450 transmits the generated stage information to the probe device 200 (step S316). At this time, the information indicating the retest may be added with the identification ID of the measuring stage 220 on which positioned is the semiconductor wafer which is decided to be retested, the identification ID of the measuring stage 220 at the retest destination and information indicating the retest corresponded with the stage information respectively.

A signal indicating the suspension of the wafer probe test is transmitted to the tester 300 performing the wafer probe test on the probe card 600 judged as a defect (step S317).

(14) Measuring Stage Stop Processing (Step S318)

The device control portion 280 of the probe device 200 receives the identification ID of the measuring stage 220 which is added with the information indicating the nonuse and the information indicating the retest. The device control portion 280 prohibits the use of the pertinent measuring stage 220.

(15) Retest of Semiconductor Wafer (Step S319, Steps S307 to S314)

The device control portion 280 of the probe device 200 prepares for the retest of the semiconductor wafer which was undergone the wafer probe test on the measuring stage 220 which was added with the information indicating the nonuse (step S319). Namely, the device control portion 280 decides the measuring stage 220 onto which the semiconductor wafer to be retested is conveyed. Normally, it is decided to be an adjacent measuring stage 220. At this time, the device control portion 280 decides a conveyance destination of the untested semiconductor wafer by selecting from the measuring stages 220 other than the measuring stage 220 to which the information indicating the nonuse is added and the measuring stage 220 to be retested (step S307).

Since the processing in steps S308 to S314 is similar to the first semiconductor wafer test, its detailed description is omitted.

(16) Defect Determination Processing of Probe Card (Step S320)

Based on the reception of the retest result of the semiconductor wafer, the card correlation judgment portion 440 of the processing device 400 determines a defect judgment of the probe card by the defect judgment portion 430.

Specifically, the card correlation judgment portion 440 reads the wafer probe result of the retest from the storage portion 420. Besides, the card correlation judgment portion 440 judges a difference upon reading the first wafer probe result of the retested semiconductor wafer. If there is no difference in information as a result of the comparison, the card correlation judgment portion 440 releases the judgment of a defect of the probe card 600. If there is a difference in information as a result of the comparison, the card correlation judgment portion 440 determines the defect judgment of the probe card 600.

(17) Transmission of Information (Step S321)

When the defect judgment of the probe card 600 is released, the card correlation judgment portion 440 transmits the information indicating the release of the defect and the identification ID of the probe card 600 judged as the nonuse in correspondence with each other to the device control portion 450. The device control portion 450 transmits to the probe device 200 the identification ID of the probe card 600 judged as the nonuse in correspondence with the information indicating usable.

(18) Measuring Stage Stop Processing (Step S322)

The device control portion 280 of the probe device 200 receives the identification ID of the measuring stage 220 to which added is the information indicating usable. The device control portion 280 releases the inhibition of use of the pertinent measuring stage 220. Then, the untested semiconductor wafer is also conveyed to the measuring stage 220 that the nonuse judgment is released.

(19) Termination of Wafer Probe Test (Steps S323, S324)

The tester 300 stops the wafer probe test upon receiving a signal indicating a stop of the wafer probe test in the step S315 (S323).

There is a case that all the wafer probe test results and the wafer probe results become "Pass". In such a case, the wafer probe test is terminated after all the semiconductor wafers housed in the pods 110, 120 are undergone the probe test (step S324).

As described above, the use of the measuring stage 220 is prohibited by the defect judgment of the probe card 600 by the defect judgment portion 430, the semiconductor wafer undergone the wafer probe test by the probe card 600 which was judged as defective is immediately retested on a nearby measuring stage 220.

It is determined whether the probe card 600 is out of order or the semiconductor chips on the semiconductor wafer are defective according to the first wafer probe results and the retested wafer probe results.

Since the semiconductor wafer is retested on the measuring stage 220 near the measuring stage 220 used for the first test, a time for conveying the semiconductor wafer whose retest is required is short, and the retest can be performed quickly. Therefore, an efficient wafer probe test becomes possible.

Conventionally, the wafer probe test was sometimes performed by the probe device not provided with plural measuring stages. And, it sometimes had the following problems.

A. If the probe card has a defect, it is necessary to stop the wafer probe test and to exchange the probe card having a defect. Since the exchange of the probe card takes time, the wafer probe test comes to take a long time accordingly.

B. Plural probe devices are used occasionally to perform the wafer probe test, but it is necessary to avoid interferences by wiring extended from the individual probe devices. Namely, it is necessary to provide a large area for arrangement of the individual probe devices. Since the position (for example, an inspection room) where the probe devices are arranged has a limited space, it is desirable that the area occupied by the probe devices and the like is small.

On the other hand, the semiconductor processing system 1 of this embodiment has the probe device 200 with the plural measuring stages 220, so that even if the wafer probe test by one of the measuring stages 220 is stopped, the other measuring stages 220 can be used to perform the wafer probe test. Therefore, it is possible to perform an efficient wafer probe test. In other words, it is prevented that the wafer probe test comes to take a long time, as the wafer probe test does not need to stop.

Since the probe device 200 is provided with plural measuring stages 220, wiring and the like can be done efficiently, and a space occupied by the probe device 200 and the like can be made smaller than the provision of plural probe devices not having the measuring stage.

Although the semiconductor processing system 1 according to one embodiment of the invention has been described above, the invention is not limited to the embodiment described above. It is to be understood that modifications and variations of the embodiment can be made without departing from the spirit and scope of the invention.

Other Embodiment

Another example of the conveying sequence of the semiconductor wafers to the individual measuring stages 220 is described below with reference to FIG. 18 and FIG. 19.

First, a conveying sequence of each semiconductor wafers of different kinds to each of the individual measuring stages 220 is described below with reference to FIG. 18. FIG. 18 is a conceptual view showing another example of the conveying sequence of the semiconductor wafers to the individual measuring stages 220.

For example, a case that semiconductor wafers W01 to W10 of kind A are housed in the pod 110 and semiconductor wafers X01 to X05 of kind B are housed in the pod 120 is described below.

In this case, the conveying arm 230 conveys sequentially the semiconductor wafers W01 and W02 which are sequentially taken out of the pod 110 to the measuring stage 220 (No. 1) and the measuring stage 220 (No. 2). Besides, the conveying arm 230 conveys sequentially the semiconductor wafers X01 and X02 which are sequentially taken out of the pod 120 to the measuring stage 220 (No. 3) and the measuring stage 220 (No. 4).

And, the conveyed semiconductor wafers W01, W02, X01, X02 are subjected to the wafer probe test ("test number 1" in the drawing).

After the wafer probe test, the conveying arm 230 exchanges the semiconductor wafers W01, W02 on the measuring stage 220 (No. 1) and the measuring stage 220 (No. 2) and the semiconductor wafers W03 to W04 in the pod 110. Besides, the conveying arm 230 exchanges the semiconductor wafers X01, X02 on the measuring stage 220 (No. 3) and the measuring stage 220 (No. 4) and the semiconductor wafers X03 to X04 in the pod 110.

Namely, the semiconductor wafers of kind A are conveyed sequentially to the measuring stage 220 (No. 1) and the measuring stage 220 (No. 2). The semiconductor wafers of kind B are sequentially conveyed to the measuring stage 220 (No. 3) and the measuring stage 220 (No. 4).

The conveyed semiconductor wafers are subjected to the wafer probe test ("test numbers 2 to 5" in the drawing).

When the measuring stage 220 (No. 1) becomes nonuse in the wafer probe test, the semiconductor wafer of kind A is conveyed to the measuring stage 220 (No. 2) and retested.

Even in a case of the retest, the semiconductor wafers of kind A are not conveyed to the measuring stage 220 (No. 3) and the measuring stage 220 (No. 4). Similarly, when the measuring stage 220 (No. 3) became nonuse in the wafer probe test, the semiconductor wafer of kind B is conveyed to the measuring stage 220 (No. 4) and retested.

Even in the case of the retest, the semiconductor wafers of kind B are not conveyed to the measuring stage 220 (No. 1) and the measuring stage 220 (No. 2).

As described above, even when the wafer probe test is performed on each of the different kinds by the semiconductor processing system 1, the retest of the semiconductor wafers can be performed quickly by performing on the measuring stage 220 near the measuring stage 220 used for the first test. Therefore, an efficient wafer probe test becomes possible.

Conveying sequences of the semiconductor wafers to the individual measuring stages 220 of different processes are described below with reference to FIG. 19. FIG. 19 is a conceptual view showing another example of the conveying sequence of the semiconductor wafers to the individual measuring stages 220.

For example, a case that the semiconductor wafers W01 to W10 of a process A are housed in the pod 110 and the semiconductor wafers X01 to X05 of the process A are housed in the pod 120 is described below. The individual semiconductor wafers housed in the pods 110, 120 are of the same kind.

Here, the wafer probe test on the measuring stage 220 (No. 1) to the measuring stage 220 (No. 3) is determined to be the process A, and the wafer probe test after the process A is determined as the process B.

The conveying arm 230 conveys sequentially the semiconductor wafers W01 to W03, which are sequentially taken out of the pod 110, to the measuring stage 220 (No. 1) to the measuring stage 220 (No. 3). But, they are not conveyed to the measuring stage 220 (No. 4).

The wafer probe test is performed on the conveyed semiconductor wafers W01 to W03 ("test number 1" in the drawing).

After the wafer probe test, the conveying arm 230 exchanges the semiconductor wafers W01 to W03 on the measuring stage 220 (No. 1) to the measuring stage 220 (No. 3) and the semiconductor wafers W04 to W06 in the pod 110. Here, the conveying arm 230 conveys the semiconductor wafer W01 to the measuring stage 220 (No. 4). And, the wafer probe test is performed on the conveyed individual semiconductor wafers ("test number 2" in the drawing).

Namely, after the wafer probe test by the process A, the semiconductor wafer is conveyed to the measuring stage 220 (No. 4), and the wafer probe test is performed by the process B. After that, the processing is continued until the wafer probe test on all the semiconductor wafers is completed.

If any of the measuring stage 220 (No. 1) to the measuring stage 220 (No. 3) becomes unusable in the wafer probe test, a retest is performed on any of the remaining measuring stage 220 (No. 1) to measuring stage 220 (No. 3).

As described above, even when the wafer probe test is performed for each different process, the semiconductor processing system 1 can perform the retest of the semiconductor wafer quickly by performing the retest of the semiconductor wafer on the measuring stage 220 which is near the measuring stage 220 used for the first test. Namely, an efficient wafer probe test becomes possible.

What is claimed is:

1. A probe device, comprising:
a plurality of measuring stages to which a respective plurality of probe cards for inspecting semiconductor wafers are connected;
a first storage portion for storing a first identifier for identifying the plurality of probe cards and a second identifier for identifying the plurality of measuring stages in correspondence with each other;
a first conveying portion for conveying a semiconductor wafer to a first measuring stage to which a first probe card is connected;
a first inspection control portion for controlling the inspection of the semiconductor wafer by the first probe card;
a receiving portion for receiving stage information including information showing nonuse of the first measuring stage and at least one of the first or second identifier from a processing device;
a second conveying portion for conveying the semiconductor wafer to a second measuring stage, to which a second probe card different from the first probe card is connected, according to the received stage information; and
a second inspection control portion for controlling the inspection of the semiconductor wafer by the second probe card.

2. The probe device according to claim 1, further comprising:
a first reading portion for reading the first identifier for identifying the plurality of probe cards from the plurality of probe cards;
a second storage portion for storing the second identifier for identifying each of the plurality of measuring stages;
a second reading portion for reading the second identifier from the second storage portion; and
a write portion for writing the read first and second identifiers correspondingly into the first storage portion.

3. The probe device according to claim 1, further comprising:
a housing portion for housing semiconductor wafers of first and second kinds different from each other;
a third storage portion for storing information indicating the first and second kinds;
a third reading portion for reading the information indicating the first and second kinds from the third storage portion; and a transmission portion for transmitting the read information indicating the first and second kinds to the processing device.

4. The probe device according to claim 3, further comprising:
 a second receiving portion for receiving from the processing device the second identifier indicating a measuring stage usable for inspecting the semiconductor wafers of each of the first and second kinds; and
 a third conveying portion for conveying the semiconductor wafer to a third measuring stage according to the received second identifier.

5. The probe device according to claim 1, further comprising:
 a housing portion for housing semiconductor wafers of mutually different first and second processes;
 a third storage portion for storing information indicating the first and second processes;
 a third reading portion for reading the information indicating the first and second processes from the third storage portion; and
 a transmission portion for transmitting the read information indicating the first and second processes to the processing device.

6. The probe device according to claim 5, further comprising:
 a second receiving portion for receiving from the processing device the second identifier indicating a measuring stage usable for inspecting the semiconductor wafers of each of the first and second processes; and
 a third conveying portion for conveying the semiconductor wafer to a third measuring stage according to the received second identifier.

7. A processing device which is connected to a probe device to which connected are a plurality of probe cards for inspecting semiconductor wafers and a test device for performing the inspection, comprising:
 a storage portion for storing a first identifier for identifying the plurality of probe cards and a second identifier for identifying a plurality of measuring stages connected to corresponding ones of the plurality of probe cards;
 a first receiving portion for receiving a first inspection result, including the first identifier for identifying the plurality of probe cards, from at least one of the probe device or the test device;
 a first judgment portion for judging the use/nonuse of the probe cards according to the first inspection result;
 a transmission portion for transmitting information indicating at least one of the probe cards judged as nonuse or the measuring stages corresponded with the probe cards to the probe device;
 a second receiving portion for receiving a second inspection result, including the first identifier for identifying the plurality of probe cards, from at least one of the probe device or the test device; and
 a second judgment portion for determination or release of the judgment of nonuse on at least one of the probe cards or the measuring stages according to the first and second inspection results.

8. The processing device according to claim 7,
 wherein the first judgment portion judges use/nonuse of the probe cards according to information indicating a defect of the semiconductor wafer included in the first inspection result.

9. The processing device according to claim 7,
 wherein the transmission portion transmits information indicating nonuse in corresponding with at least one of the first or second identifier to the probe device.

10. The processing device according to claim 7,
 wherein if the second inspection result includes a reinspection result of the semiconductor wafer inspected by the first inspection, the second judgment portion compares the reinspection result with the first inspection result of the reinspected semiconductor wafer and determines or releases the nonuse judgment on at least one of the probe cards or the measuring stages.

11. The processing device according to claim 7, further comprising:
 a storage portion for storing the second identifier for the measuring stage usable for the inspection of the semiconductor wafers of each kind;
 a receiving portion for receiving information indicating first and second kinds which are different from each other from the probe device; and
 a transmission portion for transmitting to the probe device the second identifier usable for each of the first and second kinds in correspondence with the received information indicating the first and second kinds.

12. The processing device according to claim 7, further comprising:
 a storage portion for storing the second identifier for the measuring stage usable for the inspection of the semiconductor wafer of each process;
 a receiving portion for receiving information indicating first and second processes which are different from each other from the probe device; and
 a transmission portion for transmitting to the probe device the second identifier usable for each of first and second processes in correspondence with information indicating the received first and second processes.

13. A probe testing method for inspecting a semiconductor wafer, comprising:
 reading from a plurality of probe cards a first identifier for identifying the plurality of probe cards for inspecting the semiconductor wafer;
 reading a second identifier for identifying a plurality of measuring stages, to which the plurality of probe cards are connected respectively, from a first storing unit which stores the second identifier;
 storing the read first and second identifiers in correspondence with each other into a second storing unit;
 conveying the semiconductor wafer to a first measuring stage to which a first probe card is connected;
 inspecting the semiconductor wafer by the first probe card to obtain a first inspection result;
 judging use/nonuse of a probe card according to the first inspection result;
 conveying the semiconductor wafer to a second measuring stage to which connected is a second probe card different from the probe card judged as nonuse; and
 inspecting the semiconductor wafer by the second probe card to obtain a second inspection result.

14. The probe testing method according to claim 13, further comprising:
 determining or releasing the judgment of nonuse on at least one of the probe card or the measuring stage according to the first and second inspection results.

* * * * *